(12) United States Patent
Liang et al.

(10) Patent No.: US 8,351,220 B2
(45) Date of Patent: Jan. 8, 2013

(54) ELECTROMAGNETIC INTERFERENCE SHIELDING STRUCTURE INCLUDING CARBON NANOTUBE OR NANOFIBER FILMS AND METHODS

(75) Inventors: Zhiyong Liang, Tallahassee, FL (US); Ben Wang, Tallahassee, FL (US); Chun Zhang, Tallahassee, FL (US); Jin Gyu Park, Tallahassee, FL (US)

(73) Assignee: Florida State University Research Foundation, Tallahassee, FL (US)

( * ) Notice: Subject to any disclaimer, the term of this patent is extended or adjusted under 35 U.S.C. 154(b) by 277 days.

(21) Appl. No.: 12/695,850

(22) Filed: Jan. 28, 2010

(65) Prior Publication Data
US 2010/0188833 A1 Jul. 29, 2010

Related U.S. Application Data

(60) Provisional application No. 61/147,939, filed on Jan. 28, 2009.

(51) Int. Cl.
*H05K 9/00* (2006.01)
(52) U.S. Cl. .................................. 361/818; 361/816
(58) Field of Classification Search .............. 361/816, 361/818, 799; 174/388, 51, 35 R, 377
See application file for complete search history.

(56) References Cited

U.S. PATENT DOCUMENTS

| | | | |
|---|---|---|---|
| 4,942,013 A | | 7/1990 | Palmer et al. |
| 5,229,196 A | | 7/1993 | Seibold et al. |
| 5,938,979 A | * | 8/1999 | Kambe et al. ............ 252/500 |
| 6,031,711 A | * | 2/2000 | Tennent et al. .......... 361/303 |
| 6,624,353 B2 | * | 9/2003 | Gabower .................. 174/388 |
| 6,790,425 B1 | | 9/2004 | Smalley et al. |
| 7,354,877 B2 | * | 4/2008 | Rosenberger et al. ...... 442/194 |
| 7,459,121 B2 | | 12/2008 | Liang et al. |
| 7,641,829 B2 | | 1/2010 | Liang et al. |
| 7,745,810 B2 | * | 6/2010 | Rueckes et al. ............... 257/4 |
| 7,803,262 B2 | | 9/2010 | Haik et al. |
| 7,862,766 B2 | * | 1/2011 | Liang et al. ............... 264/485 |
| 7,892,630 B1 | * | 2/2011 | McKnight et al. .......... 428/212 |
| 2002/0150524 A1 | | 10/2002 | Smalley et al. |
| 2003/0064228 A1 | | 4/2003 | Oosedo et al. |
| 2005/0239948 A1 | | 10/2005 | Haik et al. |
| 2006/0017191 A1 | | 1/2006 | Liang et al. |
| 2006/0047052 A1 | | 3/2006 | Barrera et al. |
| 2008/0057265 A1 | * | 3/2008 | Liang et al. ............... 428/114 |
| 2008/0280115 A1 | | 11/2008 | Liang et al. |
| 2010/0227153 A1 | * | 9/2010 | Okoli et al. ............. 428/317.9 |

OTHER PUBLICATIONS

Park, Jin Gyu, et al., "Electromagnetic interference shielding properties of carbon nanotube buckypaper composites," Nanotechnology 20 (2009) 415702, pp. 1-7.*
Military Handbook—MIL-HDBK-754(AR): Plastic Matrix Composites with Continuous Fiber Reinforcement, Chapter 6-1 to 6-8, U.S. Department of Defense, Nov. 2, 2001.

(Continued)

*Primary Examiner* — Hung S Bui
(74) *Attorney, Agent, or Firm* — Sutherland Asbill & Brennan LLP

(57) ABSTRACT

A composite material for electromagnetic interference shielding is provided. The composite material comprises a stack including at least two electrically conductive nanoscale fiber films, which are spaced apart from one another by at least one insulating gap positioned between the at least two nanoscale fiber films. The stack is effective to provide a substantial multiple internal reflection effect. An electromagnetic interference shielded apparatus and a method for shielding an electrical circuit from electromagnetic interference is provided.

9 Claims, 12 Drawing Sheets

OTHER PUBLICATIONS

Wang, Shiren, et al., "Controlled nanostructure and high loading of single-walled carbon nanotubes reinforced polycarbonate composite," Nanotechnology 18 (2007) 095708, pp. 1-7.

Wang, Shiren, et al., "High-Strength and Multifunctional Macroscopic Fabric of Single-Walled Carbon Nanotubes," Adv. Mater. 2007, 19, pp. 1257-1261.

Wang, Zhi, et al., "Processing and property investigation of single-walled carbon nanotube (SWNT) buckypaper/epoxy resin matrix nanocomposites," Elsevier, Composites: Part A 35 (2004) pp. 1225-1232.

U.S. Appl. No. 11/708,428, filed Feb. 20, 2007, Wang, et al.

* cited by examiner

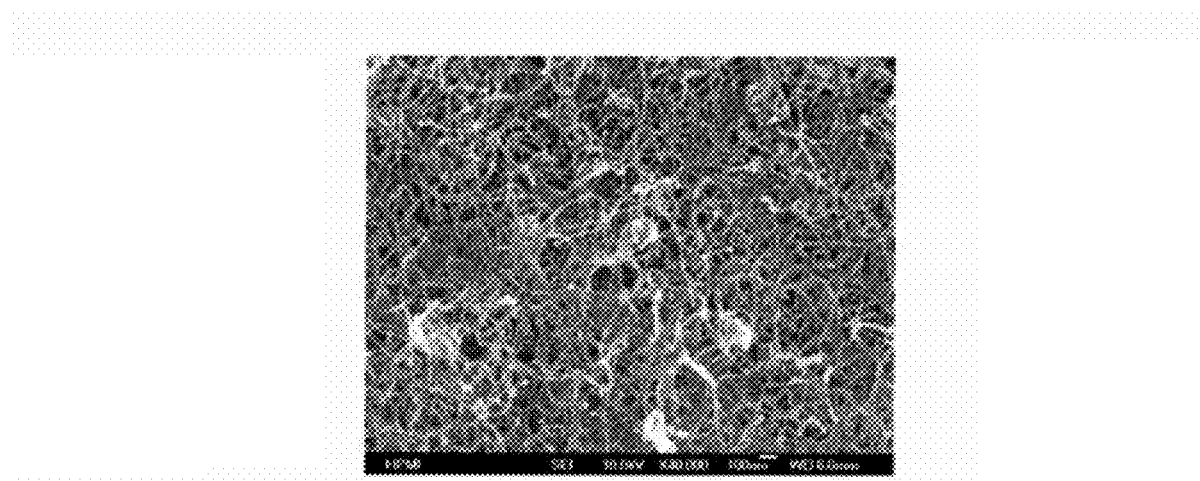
FIG. 3
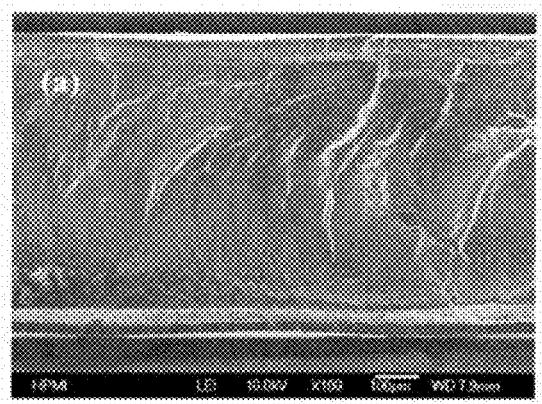 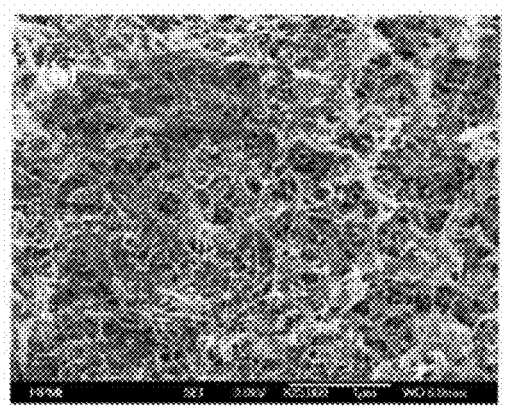
FIG. 4A                    FIG. 4B

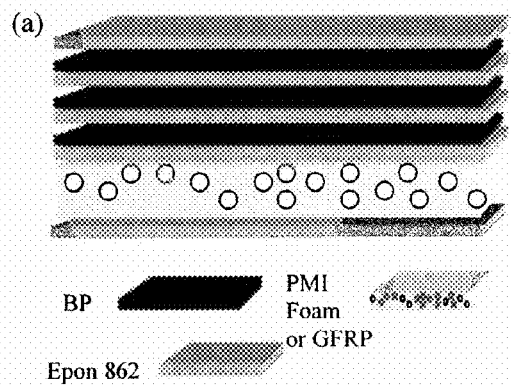
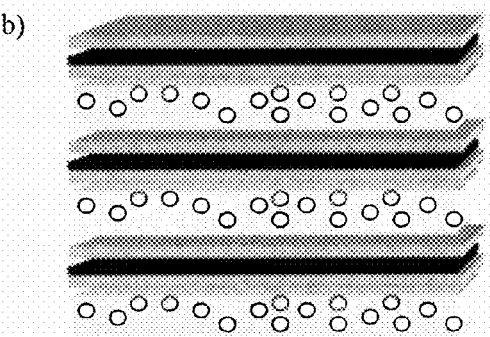
FIG. 7A            FIG. 7B
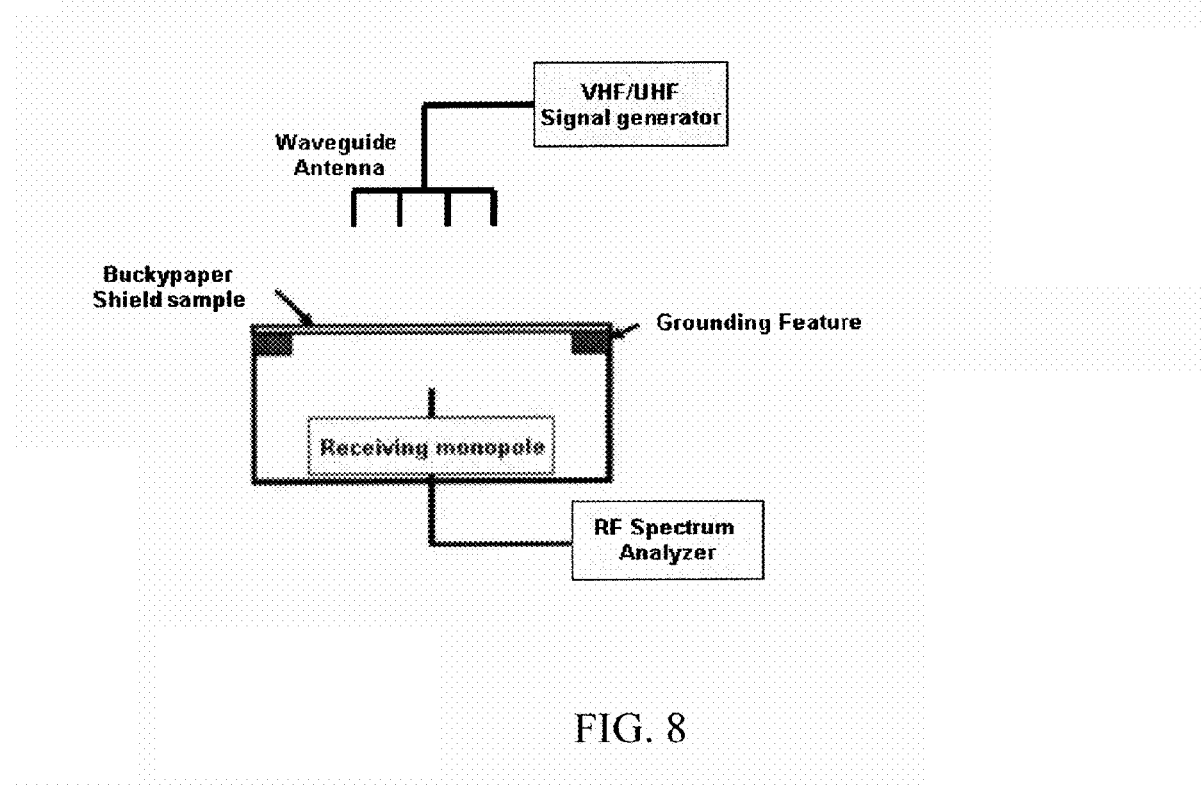
FIG. 8

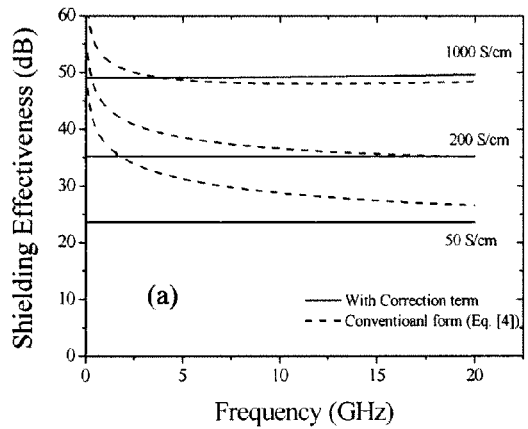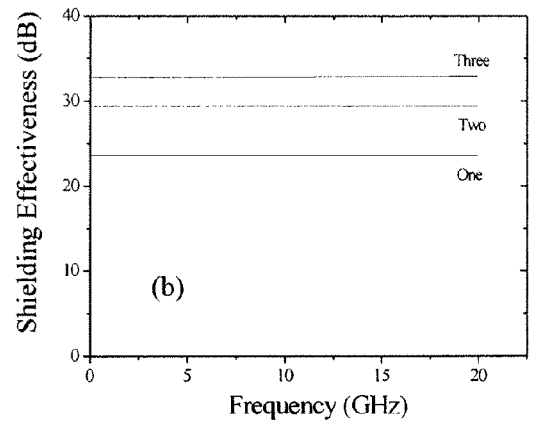
FIG. 9A    FIG. 9B
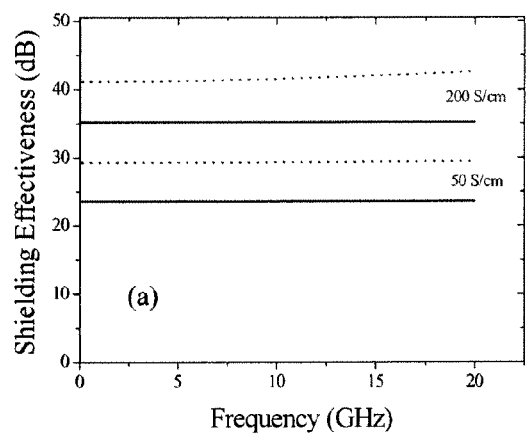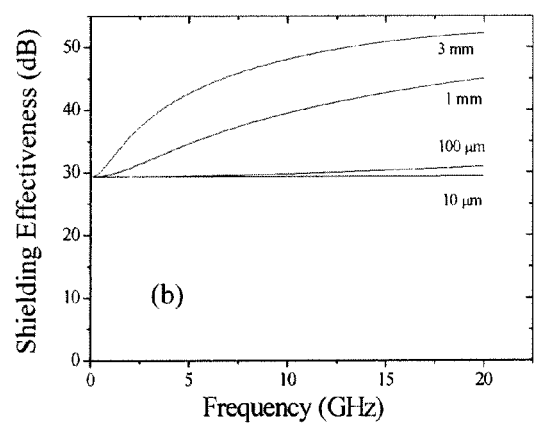
FIG. 10A    FIG. 10B

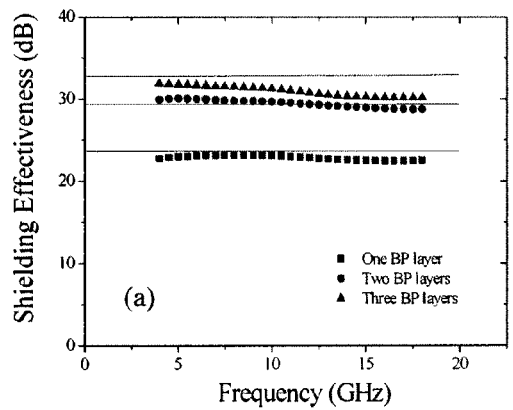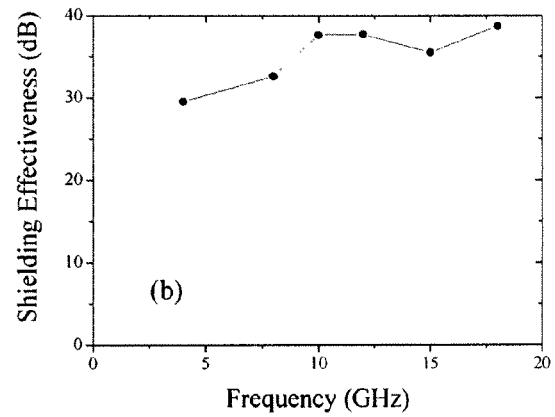
FIG. 11A  FIG. 11B
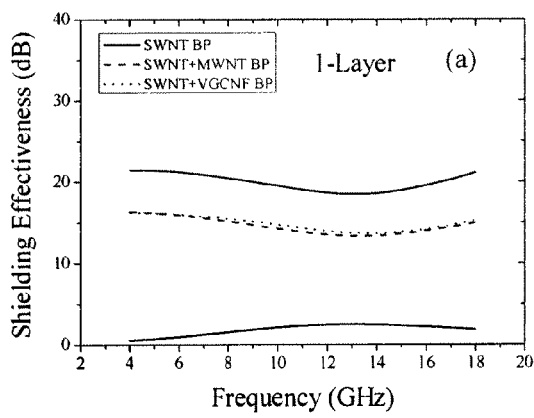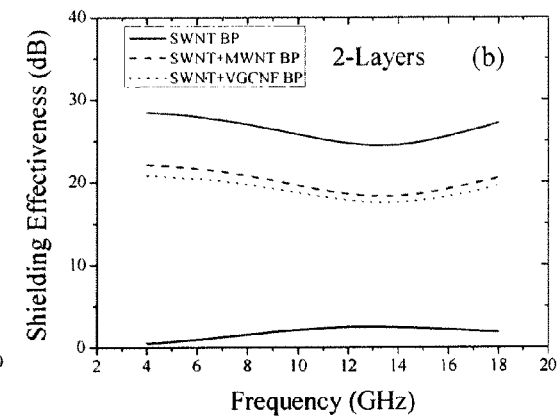
FIG. 12A  FIG. 12B

ELECTROMAGNETIC INTERFERENCE SHIELDING STRUCTURE INCLUDING CARBON NANOTUBE OR NANOFIBER FILMS AND METHODS

CROSS-REFERENCE TO RELATED APPLICATIONS

This application claims benefit of U.S. Provisional Application No. 61/147,939, filed Jan. 28, 2009, which is incorporated herein by reference.

STATEMENT REGARDING FEDERALLY SPONSORED RESEARCH OR DEVELOPMENT

This invention was made with U.S. government support under Contract No. FA9550-05-1-0271 awarded by the Air Force Office of Scientific Research. The U.S. government has certain rights in the invention.

BACKGROUND OF INVENTION

This invention relates generally to nanoscale fibers, and more particularly to electromagnetic interference (EMI) shielding structures comprising nanoscale fibers.

Due to the growing need for more powerful and compact electronic products, EMI is becoming a more significant factor in commercial and military applications. The EMI shielding of electronic devices and/or radiation sources may be a consideration in the reliable operation of devices, and possibly in preventing human health risks.

Thin film attachment or spray coating of metal, conducting polymers, and carbon black particles on a product surface may shield the product from electromagnetic waves. Metal serves as an effective shielding material because of its high conductivity, but metal adds significant weight and corrosion issues. Conducting polymers and carbon particles are lightweight but their conductivity is not as high as that of metal. Carbon nanotubes may offer an alternative for EMI shielding due to their light weight, corrosion resistance, and high conductivity ($\sim 10^6$ S/cm).

Carbon nanotube (CNT) thin films, or buckypapers (BPs), are highly conductive, lightweight materials that are easily incorporated into structural composites. These properties make BP use in EMI shield/structural multifunctional composites an attractive option. Single-walled carbon nanotube (SWNT) BP can provide high EMI shielding because of its high electrical conductivity. Since mixed SWNT and multi-walled carbon nanotube (MWNT) or carbon nanofiber (CNF) BP also has high conductivity and is lower in cost, it could also be used for EMI shielding.

Present carbon nanotube based composite techniques are sometimes based on mixing nanotubes with resin. However, such methods can fail to achieve high nanotube loading and high conductivity in composites, which would be desirable for EMI shielding. To increase the electrical conductivity and mechanical properties, higher loading of CNTs in composites is desirable. However, CNT composites made by mixing CNTs with a polymer matrix are difficult to achieve high CNT loading (i.e., >10 wt. %). Higher loading will lead to high viscosity and agglomeration of the CNTs, thus undesirably decreasing the mechanical properties and quality of the composites.

It would therefore be desirable to provide improvements in EMI shielding structures having nanotubes and/or nanofiber films. In particular, it would be desirable to provide improved EMI shielding structures that may be produced in a relatively lightweight form and at a relatively low cost. It also would be desirable to provide improved methods for producing EMI shielding structures that include nanotubes and nanofiber films.

SUMMARY OF THE INVENTION

A composite material for electromagnetic interference shielding is provided. In one aspect, the composite material comprises a stack including at least two electrically conductive nanoscale fiber films, which are spaced apart from one another by at least one insulating gap positioned between the at least two nanoscale fiber films. The stack is effective to provide a substantial multiple internal reflection effect.

In certain embodiments, the insulating gap comprises air. In other embodiments, the insulating gap comprises a dielectric film. In some embodiments, each of the at least two nanoscale fiber films and the at least one insulating gap meet at a distinct interface. In one embodiment, the dielectric film comprises polyethylene, polyethylene terephthalate, polyetheretherketone, or a combination thereof.

In certain embodiments, the stack has a thickness from about 1 mm to about 2.5 mm. In other embodiments the insulating gap has a thickness from about 200 µm to about 2 mm. In one embodiment, at least one of the nanoscale fiber films has a conductivity of at least 5 S/cm.

In some embodiments, at least one of the nanoscale fiber films comprises a buckypaper. In another embodiment, the stack provides an electromagnetic interference shielding effectiveness ranging from 5 dB to 100 dB.

In certain embodiments, the nanoscale fiber films have substantially not been infiltrated with a resin, polymer, or epoxy material.

In another aspect, an electromagnetic interference shielded apparatus is provided. The apparatus includes an electrical circuit in need of electromagnetic interference shielding and a body at least partially surrounding the electrical circuit. The body comprises a composite material that includes at least two electrically conductive nanoscale fiber films overlying and spaced apart from one another with at least one insulating gap positioned between the at least two nanoscale fiber films. The nanoscale fiber films and the insulating gap are effective to provide a substantial multiple internal reflection effect in shielding the electrical circuit from electromagnetic interference.

In certain embodiments, at least one of the nanoscale fiber films comprises a buckypaper and the at least one insulating gap comprises air or a dielectric film.

In one embodiment, the composite material further comprises one or more structural materials.

In yet another aspect, a method for shielding an electrical circuit from electromagnetic interference is provided. The method comprises positioning a composite material between the electrical circuit and an electromagnetic energy transmission source. The composite material comprises at least two electrically conductive nanoscale fiber films overlying and spaced apart from one another with at least one insulating gap positioned between the at least two nanoscale fiber films. The nanoscale fiber films and the insulating gap are effective to provide a substantial multiple internal reflection effect to shield the electrical circuit from electromagnetic interference generated by the transmission source.

BRIEF DESCRIPTION OF THE DRAWINGS

FIG. 3 is the scanning electron microscope image of a SWNT/MWNT mixed BP as described in Example 1.

FIG. 4A is a SEM image of the fracture surface of a BP composite made in Example 1. FIG. 4B is an enlarged SEM image of the BP region in the composite.

FIG. 7 is a schematic illustration of embodiments of composite structures made in Examples 2 and 3. FIG. 7A and FIG. 7B illustrate the structures of composites with three SWNT BP layers on the surface of PMI foam or GFRP and SWNT BP layers with alternating PMI foam or GFRP as a insulating gap, respectively.

FIG. 8 illustrates the apparatus for a modified MIL-STD-285 test method used in Examples 2 and 3.

FIG. 9A is a graph showing the estimated SE of one layer BP composites based on their conductivity with and without a multiple reflections induced correction term ($SE_M$). FIG. 9B is a graph showing the SE estimate result for multiple attached BP layers with different total thickness including a correction term.

FIG. 10A is a graph showing the effect of the composite design on SE with correction term ($SE_M$). FIG. 10B is a graph showing the simulated SE of two BP layers with different airgap ($\in_0$) distances.

FIG. 11A is a graph showing the SE of embodiments of composites having one, two, and three adjacent BP layers on the surface of PMI foam as determined by the modified MIL-STD-265 method. FIG. 11B is a graph showing the SE of a composite having three BP layers with 2 mm thick PMI foams as shown in FIG. 7B as measured by MIL-STD-461C.

FIGS. 12A-B are graphs showing the SE of BP composites with one and two surface BP layers attached to the glass fiber reinforced polymer (GFRP), respectively, as described in Example 3.

DETAILED DESCRIPTION OF THE INVENTION

Figure 1:
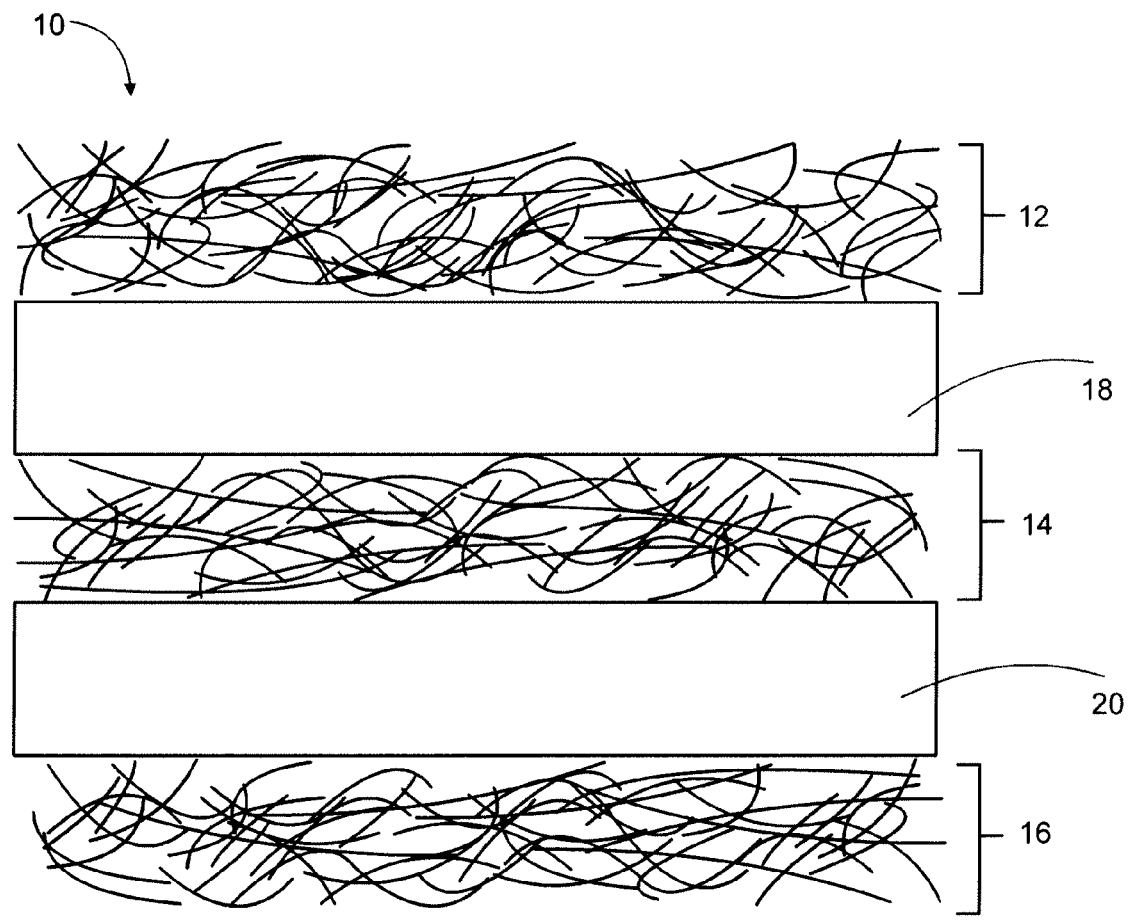
FIG. 1 is a schematic drawing of a cross-section of an embodiment of a composite 10 structure comprising stacked layers of buckypapers and polyethylene films.

Nanoscale fiber film composite materials and methods of manufacture thereof have been developed for use in EMI shielding. In one aspect, the composite materials include a stack of at least two nanoscale fiber films spaced apart from one another by at least one insulating gap. The stack is effective to provide a substantial multiple internal reflection effect.

In particular embodiments, high EMI shielding effectiveness (SE) is achieved due to the use of multiple internal reflection effects resulting from the insertion of insulating gaps between nanoscale fiber films in the composites. In one embodiment, two, three, four, five, or more layers of BP are stacked and are respectively separated by one, two, three, four, or more insulating gaps. In certain embodiments, the insulating gaps have a thickness ranging from 200 μm to 2 mm (e.g., 0.5 mm to about 1.5 mm). Thus, a composite material's absorption loss may be increased due to the thickness of conducting material, and yet the composite may be almost as thin as the total thickness of the insulating gaps, since the thickness of individual BP layers may be less than 30 μm. Polymer insulators, such as low density polyethylene (LIME) or polyethylene terephthalate (PET), may provide improved EMI shielding and flexibility. With the selection of a low dielectric polymer, the EMI SE may be improved as described herein.

The SE is the sum of absorption, reflection, and multiple reflections in the shield materials. For metal based shielding materials, the contribution from multiple internal reflections is usually ignored. However, multiple internal reflections cannot be ignored in BP nanocomposites because of their small absorption loss and multiple reflection contributions due to the large surface areas of BP. Thus, the SE of BP composites is affected by the conductivity and thickness of BP layers. The EMI SE may not, however, linearly increase with the increase of the number of BP layers that are stacked adjacent to one another. The contribution of the multiple internal reflections to the total SE may be small as a result of directly stacking multiple BP layers together.

BP based composites may desirably be used for EMI shielding because of the BP's high concentration of carbon nanotubes (10-65 wt. % or higher) and the high conductivity provided by the BP. The high loading of nanotubes may be achieved in BP composites, without losing the nanotubes' mechanical properties. Thus, BP composites' high conducting nanotube networks further improve EMI SE. In addition, by choosing particular BP layer stacking structures, improved EMI SE may be achieved with the same amount of nanotubes. Furthermore, BPs advantageously may be infiltrated with a matrix material and incorporated into a structural composite and conventional fiber-reinforced composite manufacturing processes. These properties can provide a cost-effective technical approach to realize improved EMI shield/structural multifunctional composites.

The nanoscale fiber film composite materials and methods have an excellent potential for use in fabricating lightweight EMI shielding structures, devices and multifunctional nanocomposites. Exemplary applications include producing EMI shielding structures and composite structures for aerospace, automobile and electronics industries, where highly efficient EMI shielding and lighter weights are highly desired.

The Composite and the Shielded Device

In one aspect, an electromagnetic interference shielded apparatus including an electrical circuit in need of electromagnetic interference shielding is provided. In one embodiment, the apparatus includes a body at least partially surrounding the electrical circuit. The body comprises at least two nanoscale fiber films spaced apart from one another by at least one insulating gap, wherein the stack is effective to provide a substantial multiple internal reflection effect.

As used herein, "distinct interface" refers to the boundary between two adjacent surfaces or surface layers (e.g., a BP and an insulating gap). The distinct interface acts as a discrete boundary such that the adjacent layers do not act effectively as a single, continuous shielding material layer within the EMI shielding composite. In particular, in certain embodiments, a distinct interface between two material layers results in a SE from multiple internal reflections which is greater than 5 dB. In other embodiments, a distinct interface between two material results in a SE from multiple internal reflections which is greater than 20 dB.

In certain embodiments, the electromagnetic interference shielding apparatus includes body having an electrical circuit disposed therein; and a stack of at least two nanoscale fiber films spaced apart from one another by at least one insulating gap, wherein the device has a multiple internal reflections SE of at least 5 dB. The stack is part of the body of the apparatus.

In another aspect, a composite material is provided for shielding electromagnetic interference. This composite material includes a stack of at least two nanoscale fiber films spaced apart from one another by at least one insulating gap, wherein each of the nanoscale fiber films and the at least one insulating gap meet at distinct interfaces. In certain embodiments, the composite material may also include one or more structural or supporting materials in combination with the composite material.

FIG. 1 is a schematic drawing of a cross-section of an embodiment of a composite 10. The composite 10 includes a stack of three buckypaper layers 12, 14, 16 and two polyethylene film insulating gaps 18, 20, wherein insulating gap layers 18, 20 meet the adjacent BP layers 12, 14, 16 at discrete interfaces. In a variation of this embodiment, other polymeric films may be used in place of one or both PE film insulating gaps.

Figure 2:
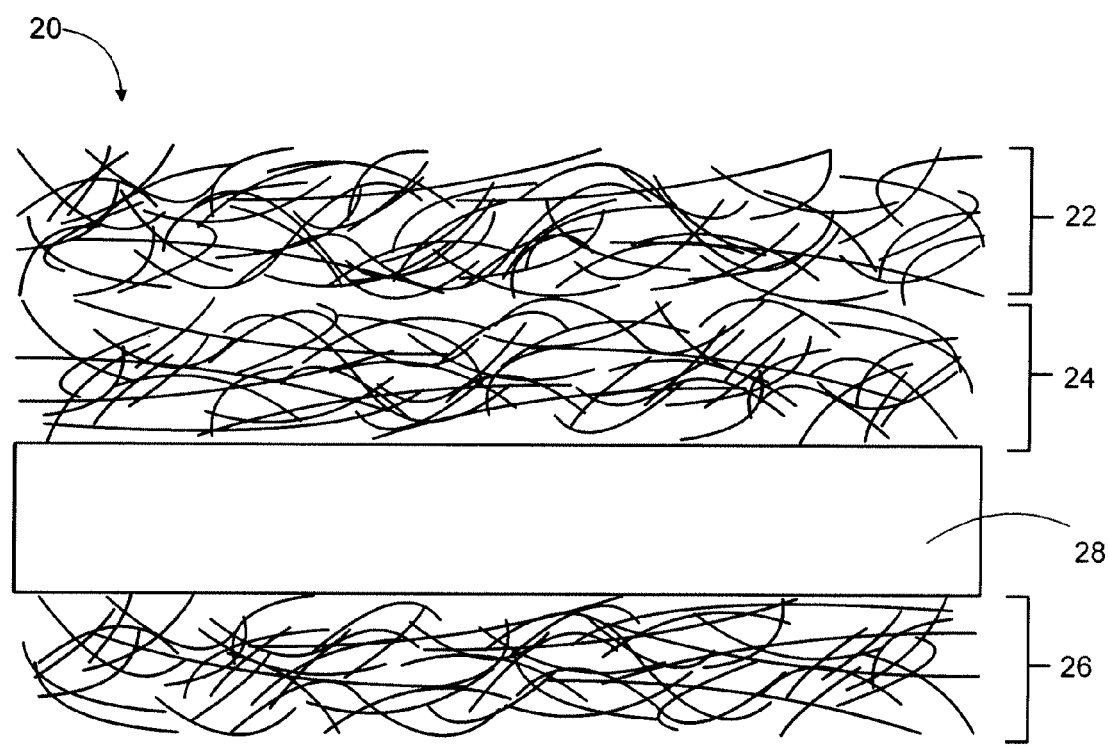
FIG. 2 is a schematic drawing of a cross-section of another embodiment of a composite 20 structure comprising stacked layers of buckypapers and a polyethylene film.

FIG. 2 is a schematic drawing of a cross-section of another embodiment of a composite 20. The composite 20 includes a stack of three buckypaper layers 22, 24, 26 and one polyethylene film insulating gap 28. Two of the buckypaper layers 24, 26 meet the insulating gap layer 28 at discrete interfaces. In contrast, the two buckypaper layers 22 and 24 do not meet at a discrete interface, as the two buckypapers would effectively at as a single (thicker) layer of shielding.

In particular embodiments, the nanoscale fiber films and the insulating gap layer(s) are adhered or attached together at least a portion of their interfacing surfaces. In some embodiments, the nanoscale fiber films are attached to an insulating gap layer by a matrix material (e.g., an epoxy resin). The matrix material may be positioned on and infused into the nanoscale fiber films such that the matrix material adheres the nanoscale fiber films to the insulating gap layer. In another embodiment, at least a portion of the insulating gap layer is melted or softened such that the insulating gap material is attached to the nanoscale fiber films. For example, a polyethylene film insulating gap layer may be partially melted so that the melted polyethylene is at least partially fused to the nanoscale fiber films.

In certain embodiments, the composite stack comprises three, four, or five nanoscale fiber films and two, three, or four insulating gaps, respectively, therebetween. In particular embodiments, the stack is flexible. For instance, the stack may include insulating gap materials having chosen thicknesses and material properties to allow the stack to be flexible, even if it includes multiple insulating gap materials between multiple BPs. Thus, a device or composite may be provided in a thin, flexible form having an EMI shielding effect that is the same as or approaches the shielding effect of multiple (thicker and/or more rigid) EMI shields.

In certain embodiments, the insulating gap has a thickness ranging from 200 μm to 2 mm. In other embodiments, the insulating gap has a thickness ranging from 50 μm to 5 mm.

In other embodiments, the stack are rigid and have a thickness of 2 mm or less. For instance, such embodiments may have a insulating gap comprising a thermoset resin selected from the group consisting of epoxy resin, cyanate resin, and polyimide resin.

In particular embodiments, the EMI shielding composite provides an electromagnetic interference shielding effectiveness ranging from 10 dB to 95 dB. In other embodiments, the EMI shielding composite provides an electromagnetic interference shielding effectiveness ranging from 10 dB to 100 dB. In still other embodiments, the EMI shielding composite provides an electromagnetic interference shielding effectiveness greater than 100 dB. In yet other embodiments, the EMI shielding composite provides an electromagnetic interference shielding effectiveness of at least 5 dB.

The EMI shielding structures may be used in essentially any application in which EMI shielding is desired, and are particularly useful in applications where lightweight and/or thin construction is important or desirable.

Nanoscale Fibers and Nanoscale Fiber Films

In certain embodiments, the EMI shielding composite includes nanoscale fibers and nanoscale fiber films, such as carbon nanoscale fiber films ("buckypaper"). As used herein, the term "nanoscale fibers" refers to a thin, greatly elongated solid material, typically having a cross-section or diameter of less than 500 nm. In certain embodiments, the nanoscale fibers are single-walled carbon nanotubes (SWNTs), multiple-walled carbon nanotubes (MWNTs), carbon nanofibers (CNFs), or mixtures thereof. Carbon nanotubes and carbon nanofibers have high surface areas (e.g., about 1,300 m$^2$/g), which results in high conductivity and high multiple internal reflection. In a preferred embodiment, the nanoscale fibers comprise or consist of carbon nanotubes, including SWNTs, MWNTs, or combinations thereof. SWNTs typically have small diameters (~1-5 nm) and large aspect ratios, while MWNTs typically have large diameters (~5-200 nm) and small aspect ratios. CNFs are filamentous fibers resembling whiskers of multiple graphite sheets.

In certain embodiments, the nanoscale fibers comprise carbon nanotubes having a mean length of at least 1 millimeter (available from Nanocomp Technologies, Concord, N.H.) (e.g., "long-MWNTs" or "millimeter-long CNTs").

As used herein, the terms "carbon nanotube" and the shorthand "nanotube" refer to carbon fullerene, a synthetic graphite, which typically has a molecular weight between about 840 and greater than 10 million grams/mole. Carbon nanotubes are commercially available, for example, from Unidym Inc. (Houston, Tex. USA) or Carbon Nanotechnologies, Inc. (Houston Tex. USA), or can be made using techniques known in the art.

The nanotubes optionally may be opened or chopped, for example, as described in U.S. Pat. No. 7,641,829 B2.

The nanotube and nanofibers optionally may be chemically modified (e.g., doped with SOCl$_2$) or coated with other materials to provide additional functions for the films produced. For example, in some embodiments, the carbon nanotubes and CNFs may be coated with metallic materials to enhance their conductivity. In other embodiments, the nanoscale fiber film or buckypaper may be treated using electron beams or chemicals to realize high electrical conductivity for high EMI SE.

As used herein, the term "nanoscale film" refers to thin, preformed sheets of well-controlled and dispersed porous networks of SWNTs, MWNTs, CNFs, or mixtures thereof. Films of carbon nanotubes and nanofibers, or buckypapers, are a potentially important material platform for many applications. Typically, the films are thin, preformed sheets of well-controlled and dispersed porous networks of SWNTs, MWNTs, carbon nanofibers CNFs, or mixtures thereof. The carbon nanotube and nanofiber film materials are flexible, light weight, and have mechanical, conductivity, and corrosion resistance properties desirable for numerous applications. The film form also makes nanoscale materials and their properties transferable to a macroscale material for ease of handling.

Nanotube buckypapers can have an areal density from 18.1 $g/m^2$ to 21.5 $g/m^2$, while offering electrical conductivity ranging from 50 S/cm to 8,000 S/cm. A highly conductive SWNT film having a 10 nm thickness gives an EMI SE of more than 20 dB at 10 GHz and a SE over 50 dB by a 10 μm thick SWNT BP. In one embodiment, the nanoscale fiber films have a conductivity of at least 5 S/cm. In another embodiment, the nanoscale fiber films have a conductivity of at least 20 S/cm.

BP may provide high EMI shielding because of its nanoscale porous structure which enhances the material's capabilities of reflection, absorption, internal reflection for microwave attenuation.

An additional advantage associated with the use of CNTs in polymeric EMI shielding composites includes the high aspect ratio of CNT filler. The high aspect ratio CNT results in a higher composite conductivity as compared to carbon black due to the latter material's lower percolation limit. In addition, any residual metal catalyst on MWNT results in their higher conductivity, which leads to better shielding performance. For lightweight EMI shielding performance and corrosion resistance, purified CNTs with less metal impurity are desired. Longer CNTs are beneficial in terms of conductivity because of the reduced intertube contact within the buckypaper.

The nanoscale fiber films can be made by any suitable process known in the art. In one embodiment, the buckypaper is made by stretching or pushing synthesized nanotube "forests" to form sheets or strips. In another embodiment, the buckypaper is made by consolidation of synthesized nanotube aerogel to form film membranes.

In some embodiments, the nanoscale fiber film materials are made by a method that includes the steps of (1) suspending SWNTs, MWNTs, and/or CNF in a liquid, and then (2) removing a portion of the liquid to form the film material. In one embodiment, all or a substantial portion of the liquid is removed. As used herein the term, "substantial portion" means more than 50 wt. %, typically more than 70 wt. %, 80 wt. %, 90 wt. %, or 99 wt. % of the liquid. The step of removing the liquid may include a filtration process, vaporizing the liquid, or a combination thereof. For example, the liquid removal process may include, but is not limited to, evaporation (ambient temperature and pressure), drying, lyophilization, heating to vaporize, using a vacuum, or a combination thereof.

The liquid includes a non-solvent, and optionally may include a surfactant (such as Triton X-100, Fisher Scientific Company, NJ) to enhance dispersion and suspension stabilization. As used herein, the term "non-solvent" refers to liquid media that essentially are non-reactive with the nanotubes and in which the nanotubes are virtually insoluble. Examples of suitable non-solvent liquid media include water, and volatile organic liquids, such as acetone, ethanol, methanol, n-hexane, benzene, dimethyl formamide, chloroform, methylene chloride, acetone, or various oils. Low-boiling point liquids are typically preferred so that the liquid can be easily and quickly removed from the matrix material. In addition, low viscosity liquids can be used to form dense conducting networks in the nanoscale fiber films.

For example, the films may be made by dispersing nanotubes in water or another non-solvent to form suspensions and then filtering the suspensions to form the film materials. In one embodiment, the nanoscale fibers are dispersed in a low viscosity medium such as water or a low viscosity non-solvent to make a suspension and then the suspension is filtered to form dense conducting networks in thin films of SWNT, MWNT, CNF, or their mixtures. Other suitable methods for producing nanoscale fiber film materials are disclosed in U.S. patent application Ser. No. 10/726,074, entitled "System and Method for Preparing Nanotube-based Composites;" U.S. Patent Application Publication No. 2008/0280115, entitled "Method for Fabricating Macroscale Films Comprising Multiple-Walled Nanotubes;" and U.S. Pat. No. 7,459,121 to Liang et al, entitled "A Method for Continuous Fabrication of Carbon Nanotube Networks or Membrane Materials."

Additional examples of suitable methods for producing nanoscale fiber film materials are described in S. Wang, Z. Liang, B. Wang, and C. Zhang, "High-Strength and Multifunctional Macroscopic Fabric of Single-Walled Carbon Nanotubes," *Advanced Materials,* 19, 1257-61 (2007); Z. Wang, Z. Liang, B. Wang, C. Zhang, and L. Kramer, "Processing and Property Investigation of Single-Walled Carbon Nanotube (SWNT) Buckypaper/Epoxy Resin Matrix Nanocomposites," *Composite, Part A: Applied Science and Manufacturing,* Vol. 35 (10), 1119-233 (2004); and S. Wang, Z. Liang, G. Pham, Y. Park, B. Wang, C. Zhang, L. Kramer, and P. Funchess, "Controlled Nanostructure and High Loading of Single-Walled Carbon Nanotubes Reinforced Polycarbonate Composite," *Nanotechnology, Vol.* 18, 095708 (2007).

In certain embodiments, the nanoscale fiber films are commercially available nanoscale fiber films. For example, the nanoscale fiber films may be preformed nanotube sheets made by depositing synthesized nanotubes into thin sheets (e.g., nanotube sheets from Nanocomp Technologies Inc., Concord, N.H.). MWNT sheets from Nancomp have substantial nanotube entanglements and possible interconnection through Nanocomp's proprietary floating catalyst synthesis and aerogel condense method. Theses MWNT sheets can reach up to a meter long and are commercially available, which makes them practical for manufacturing bulk composites.

In various embodiments, good dispersion are realized in buckypapers materials, which assists the production of high nanoscale fiber content (i.e., greater than 20 wt. %) buckypaper for high performance composites materials.

In various embodiments, the films have an average thickness from about 5 to about 100 microns thick with a basis weight (i.e., area density) of about 20 $g/m^2$ to about 50 $g/m^2$. In one embodiment, the buckypaper is a thin film (approximately 20 μm) of nanotube networks. In other embodiments, the BP is a thin film or membrane material with a thickness of 15 to 25 μm and a density about 21.5 $g/m^2$.

Insulating Gaps

As used herein, "insulating gap" refers to a layer in an EMI shielding apparatus or composite that is interposed between two conducting nanoscale fiber film layers that are positioned one on top of another. The insulating gap provides a spacing, or separation. In certain embodiments, the insulating gap comprises a dielectric material. In one embodiment, the insulating gap comprises air. The insulating gap may comprise a combination of a dielectric material and air or a dielectric material and air or another gas. For example, the combination may comprise an open- or closed-cell foam. In some embodiments, the insulating gap comprises polyethylene (e.g., low density polyethylene film (LDPE)), polyethylene terephthalate (PET), polyetheretherketone (PEEK), or a combination thereof. Flexible polymer films such as LDPE, PET, or PEEK films may be used in some embodiments to maintain BP's flexibility. Other suitable dielectric materials include polymethacrylimide foam, polypropylene, rubber, elastomers, thermoset resins (e.g., epoxy resin, cyanate resin, and polyimide resin) or other dielectric materials.

Structural Materials

The structural materials may include essentially any suitable substrate or structure. For example, the structural material may include foams, honeycombs, glass fiber laminates, Kevlar fiber composites, polymeric materials, or combinations thereof. Non-limiting examples of suitable structural materials include polyurethanes, silicones, fluorosilicones, polycarbonates, ethylene vinyl acetates, acrylonitrile-butadiene-styrenes, polysulfones, acrylics, polyvinyl chlorides, polyphenylene ethers, polystyrenes, polyamides, nylons, polyolefins, poly(ether ether ketones), polyimides, polyetherimides, polybutylene terephthalates, polyethylene terephthalates, fluoropolymers, polyesters, acetals, liquid crystal polymers, polymethylacrylates, polyphenylene oxides, polystyrenes, epoxies, phenolics, chlorosulfonates, polybutadienes, buna-N, butyls, neoprenes, nitriles, polyisoprenes, natural rubbers, and copolymer rubbers such as styrene-isoprene-styrenes, styrene-butadiene-styrenes, ethylene-propylenes, ethylene-propylene-diene monomers (EPDM), nitrile-butadienes, and styrene-butadienes (SBR), and copolymers and blends thereof. Any of the forgoing materials may be used unfoamed or, if required by the application, blown or otherwise chemically or physically processed into an open or closed cell foam.

Using no more than routine experimentation, one skilled in the art can selected structural materials for use in the EMI shielding apparatus or composite, based on properties such as operating temperature, hardness, chemical compatibility, resiliency, compliancy, compression-deflection, compression set, flexibility, ability to recover after deformation, modulus, tensile strength, elongation, force defection, flammability, or any other chemical or physical property.

In some embodiments, a structural material is combined with one or more other materials in various forms and composite materials. In certain embodiments, the composite materials may include fibrous materials dispersed into, woven into, or saturated by another material, such as a plastic, polymer, or a resin. For instance, a composite material could include carbon fibers, glass fibers, fiberglass, aramid fibers or combinations thereof dispersed in a polymeric material. In other embodiments, the composite material may additionally include adhesives, metals, or any other suitable materials to make the composite material suitable for its intended use.

The EMI Shielding Methods

In one aspect, a method is provided for shielding an electrical circuit from electromagnetic interference. In one embodiment, this method includes positioning a composite material between the electrical circuit and an electromagnetic energy transmission source (e.g., VHF/UHF signal generator). The composite material comprises at least two electrically conductive nanoscale fiber films overlying and spaced apart from one another with at least one insulating gap positioned between the at least two nanoscale fiber films. The nanoscale fiber films and the insulating gap are effective to provide a substantial multiple internal reflection effect to shield the electrical circuit from electromagnetic interference generated by the transmission source.

Non-limiting examples of devices which may include an electrical circuit in need of EMI shielding include computers, mobile and landline telephones, televisions, radios, personal digital assistants, digital music players, medical instruments, automotive vehicles, aircraft, and satellites.

Electromagnetic waves coming into a shielding conductor attenuate exponentially. The depth at which the electromagnetic field decreases to l/e of incident value is called the skin depth ($\delta$), and for highly conductive materials like metal, skin depth is given by Equation (1):

$$\delta = \frac{1}{\sqrt{(\pi f \sigma \mu)}} = \frac{1}{\alpha} \qquad \text{Equation (1)}$$

where $\sigma$ (S/m) is the electrical conductivity, f (Hz) is the frequency, $\mu$ is the magnetic permeability, and $\alpha$ is the attenuation constant. At a given frequency, high conductivity and permeability are relevant factors for better shielding.

The total effectiveness of all the EMI attenuating properties is called the shielding effectiveness (SE). The SE is the sum of all the mechanism losses measured in decibels (dB) and expressed by Equation (2):

$$SE = 10\log\frac{P_{in}}{P_{out}} = SE_A + SE_R + SE_M \qquad \text{Equation (2)}$$

where $P_{in}$ and $P_{out}$ is the power of incident and transmitted waves through a shielding material, respectively. $SE_A$ and $SE_R$ is the SE from the absorption and reflection, respectively, and the third term, $SE_M$, is the multiple reflections in the shield.

Without wishing to be bound by a particular theory, the primary mechanism for EMI shielding is believed to usually be reflection. The third term is generally neglected when $SE_A > 15$ dB. Absorption loss (penetration loss) of material with thickness of l is given by Equation (3):

$$SE_A(\text{dB}) = 8.686\alpha l \qquad \text{Equation (3)}$$

However, considering the conductivity of BP (200-1000 S/cm) and thickness of 15 μm, the $SE_A$ at 1 GHz may be between 1.2 and 2.6 dB. Therefore the multiple reflections (or correction term, $SE_M$) should not be neglected.

Generally, the EMI SE of composite materials is expressed by Simon formalism (Equation (4)):

$$SE(\text{dB}) = 50 + 10\log_{10}\frac{\sigma}{f} + 1.7t\sqrt{f\sigma} \qquad \text{Equation (4)}$$

where $\sigma$ is the volume conductivity (S/cm), t is the thickness of the sample (cm), and f is the measurement frequency (MHz). This Equation ignores the multiple internal reflections. However, a BP composite cannot exclude the multiple reflections of a BP composite are not insignificant because of the smaller absorption loss and large surface areas (~1,000 m²/g) in the materials.

Absorption loss ($SE_A$) of a multilayer structure (n-layer) is the sum of each layer and can be written in Equation (5) as:

$$SE_A(\text{dB}) = 8.686(\alpha_1 l_1 + \ldots + \alpha_n l_n) \qquad \text{Equation (5)}$$

where $\alpha$ is the attenuation constant and l is the thickness of each layer. There is nearly no contribution to absorption loss from insulation layers. The $SE_A$ is the sum of each conducting layer. But the reflection loss ($SE_R$) and multiple reflection induced correction term ($SE_M$) are not the sum of the SE contribution of each layer. $SE_R$ is determined from the intrinsic impedance of each sheet of material ($\eta_i$) and its ratio, as expressed in Equation (6):

$$SE_R = 20\log_{10}\left|\frac{(\eta_0+\eta_1)(\eta_1+\eta_2)\ldots(\eta_n+\eta_{n+1})}{2\eta_0\cdot 2\eta_1\ldots 2\eta_n}\right| \quad \text{Equation (6)}$$

where $$\eta = \sqrt{\frac{i\omega\mu}{\sigma+i\omega\varepsilon}}$$

and may be written as $$\eta = (1+i)\sqrt{\frac{\pi\mu f}{\sigma}}$$

for metal, and $\eta_0=\sqrt{\mu_0/\varepsilon_0}\approx 377\Omega$ for air, with $\sigma\sim 0$.

Inserted insulation layers have different dielectric constants and each interface has a small reflection loss even though the contribution is minor in comparison to the whole SE. If those inserted insulation layers are considered as one material with high intrinsic impedance, the reflection loss is the sum of the each BP layer. As mentioned before, one sheet of BP is not enough to neglect internal reflections in the shield due to small absorption loss. Therefore, a multiple reflection induced correction term should be considered, as shown in Equations (7) and (8):

$$SE_M = 20\log_{10}\left|\frac{[1-q_1\exp(-2\gamma_1\cdot l_1)]\ldots}{[1-q_n\exp(-2\gamma_n\cdot l_n)]}\right| \quad \text{Equation (7)}$$

$$q_n = \frac{(\eta_n-\eta_{n-1})[\eta_n-Z(l_n)]}{(\eta_n+\eta_{n-1})[\eta_n+Z(l_n)]}, \gamma=\alpha+i\beta \quad \text{Equation (8)}$$

where $Z(l_n)$ is the characteristic impedance and $\gamma$ is the propagation constant with attenuation constant ($\alpha$) and phase constant ($\beta$). In the case of air or an insulating material, $\gamma=i\omega\sqrt{\mu\varepsilon}$, and in the case of metal, $\alpha=\beta$.

Consideration of these equations and variables (e.g., as in the Examples below) will allow for more accurate modeling and design of EMI shielding composites to achieve higher a EMI SE, a lower thickness, and/or a lower weight.

The Methods for Making a Composite

In another aspect, a method is provided for making a composite material for electromagnetic interference shielding. In one embodiment, the method includes forming a stack of at least two nanoscale fiber films spaced apart from one another by at least one insulating gap, wherein each of the nanoscale fiber films and the at least one insulating gap meet at distinct interfaces. The composite material is then used to construct any of a myriad of devices or components that are designed to provide EMI shielding. For example, a housing may be fabricated with walls comprising or formed of the composite material. For example, an electronics device may be encased in the composite material.

Incorporating a Insulating Gap into a Film Stack

The formation of a stack of the nanoscale fiber films with one or more insulating gaps to produce a composite may be done using a variety of techniques known in the art that suitably preserve the integrity of the nanoscale fiber films. In one embodiment, the stack may be configured so that the nanoscale fiber films are separated from each other by an air gap, by using spacers on the edges of the nanoscale fiber films, for example.

In certain embodiments, the nanoscale fiber films may be attached to adjacent insulating gaps by mechanical means, such as a clamp, use of heat and pressure, or by using a roll press machine to press the layers together.

In another embodiment, the step of forming the stack of the nanoscale fiber films and one or more insulating gap layers comprises impregnating the nanoscale fiber films with a flowable material before, during, or after forming the stack. The "flowable material" is, or is a precursor of, a structural material, which is provided in a fluid form during manufacture of the composite. In one embodiment, the stack of nanoscale fiber films and insulating gap(s) is held together by the adhesive properties of the flowable material impregnated into the nanoscale fiber films.

In some embodiments, the flowable material is solidified. The solidifying step may occur by a chemical or physical change in the flowable material. In one embodiment, the flowable material comprises an epoxy resin and the solidifying step comprises curing the epoxy resin. In one case, the flowable material undergoes a curing process following contact with the nanoscale fiber film. Non-limiting examples of suitable co-curing processes include hand lay-up, VaRTM (vacuum added resin transfer molding)/RTM (resin transfer molding), and pregreg/vacuum bagging. In another embodiment, the flowable material comprises a thermoplastic material heated above its melting temperature and the solidifying step comprises cooling the thermoplastic material to below its melting temperature.

In another embodiment, the method further comprises selectively melting the insulating gap material before, during, or after the formation of the stack. The melting of the insulating gap material may be used to improve adhesion of the insulating gap material with the nanoscale fiber films or to reposition the insulating gap material within the stack. For example, a stack of nanoscale fiber films including PE film insulating gaps disposed therebetween may be hot pressed to melt at least a portion of the PE film (a portion of which may flow onto or into the nanoscale fiber films). Upon removal of the stack from the hot press apparatus, the melted PE film may be resolidified.

Incorporating the Composite Material into an Apparatus

The step of incorporating the composite material including nanoscale fiber films and one or more insulating gaps into a body (or device) may include adhering the composite material with an adhesive material to at least one surface of the device. The composite material may be on the outer surface of device or may be an intermediate layer in the exterior portion. The composite material may be part of a laminate structure or other composite structure in or on the exterior portion of the device. The terms "exterior portion" and "interior portion" are used herein to refer to relative orientations of the part(s) of the device that are to be shielded (i.e., interior portion) from externally generated EMI and the part(s) of the device that at least partially surround these interior portions in order to provide the desired shielding (i.e., the exterior portion). A single device may include multiple EMI shielding structures and may have shielding structures arranged to shield one or more components from EMI generated by externally and/or internally another component within the device.

The step of incorporation may involve adhering, fastening, or otherwise attaching the composite material to a surface of a part of the device using essentially any suitable means known in the art. The step of incorporation may include building the stack of nanoscale fiber films and the insulating gaps into a composite material of construction used to fabricate one or more parts of the device. For example, the composite material may serve as a substrate on which microelectronics are mounted or may be made into an encasement for a subcomponent of the device or for the whole device. In one embodiment, the step of attaching the nanoscale fiber films and the insulating gaps comprises fastening the nanoscale fiber film and the insulating gaps to at least one surface of the device using a suitable glue or adhesive known in the art. For example, the adhesive may be an epoxy or a pressure-sensitive adhesive.

The multiple layers of nanoscale fiber film and the insulating layers may have other structural or barrier material layers interposed therebetween. In one case, the step of incorporating the nanoscale fiber film and the insulating gaps includes adhering two or more layers of the nanoscale fiber film and the insulating gap to at least one surface of the device.

The compositions and methods described above will be further understood with reference to the following non-limiting examples.

Example 1

Inclusion of BP with a thickness of 10-15 µm in a composite with low density polyethylene (LDPE) film (from McMaster, 500 microns in thickness) provided EMI shielding performance, in addition to flexibility and suitable mechanical properties for handling. The polymer film and BP layers were hot pressed at slightly above the melting temperature of the polymer film (149° C.). Test panels (6"×6") were made. The total thickness of the panels (0.5 mm) was primarily due to the LDPE thickness, since the BP was very thin.

FIG. 3 shows the scanning electron microscope image of a SWNT/MWNT mixed BP. FIG. 4A shows the SEM image of the fracture surface of a BP composite made by the hot press process and including a polymer film inserted between two BP layers. The BP may be seen on the edge of the panel and LDPE covered the BP layers. FIG. 4B shows the enlarged image of the BP region in the composite. The LDPE polymer around the carbon nanotube was seen and filled some voids in the BP.

Figure 5:
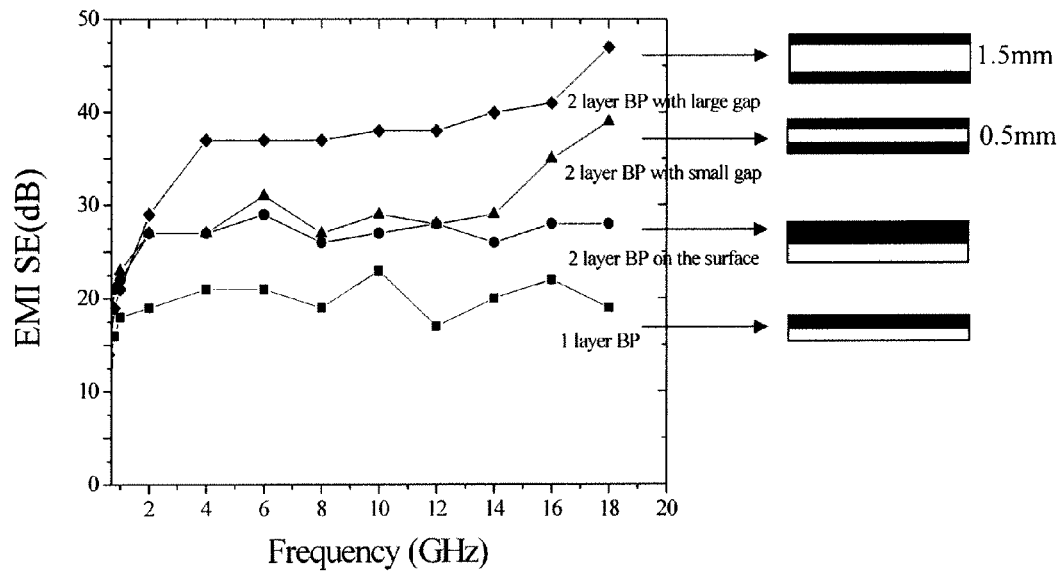
FIG. 5 is a graph of the EMI shielding effectiveness (SE) values of the embodiments of composites made in Example 1.

The effect of BP layer stacking in a composite on its EMI SE was demonstrated at high frequency ranges up to 18 GHz. For the EMI shielding tests, IEEE STD 299-2006 was adopted. FIG. 5 shows the EMI SE values of the test panels based on different stacking configurations of BP layers with LDPE films. The corresponding structures are shown to the right of the graph. A BP layer and LDPE composite had about 20 dB of SE. One more layer of BP added adjacent to the first BP layer provided an additional several dB attenuations due to the increased thickness (thus increased absorption loss). Therefore, two BP layers on the surface of polymer film give about 27 dB SE on the average, as shown in the FIG. 5.

To achieve a multiple internal reflection effect from multiple BP layers, insulating gaps between two conducting layers were used. The experimental results showed that two BP layers with an insulating gap had better shielding performance than two BP layers directly stacked together. Since the EMI SE of the insulating LDPE polymer was negligible, the SE improvement in the BP with an insulating gap was from the stacking configuration effectively resulting in multiple EMI shields. A larger gap between conducting BP layer nearly doubled the shielding performance. To get a multiple shielding effect at high frequency range (over 4 GHz), at least 1.5 mm gaps were needed between each EMI shielding BP layer.

Figure 6:
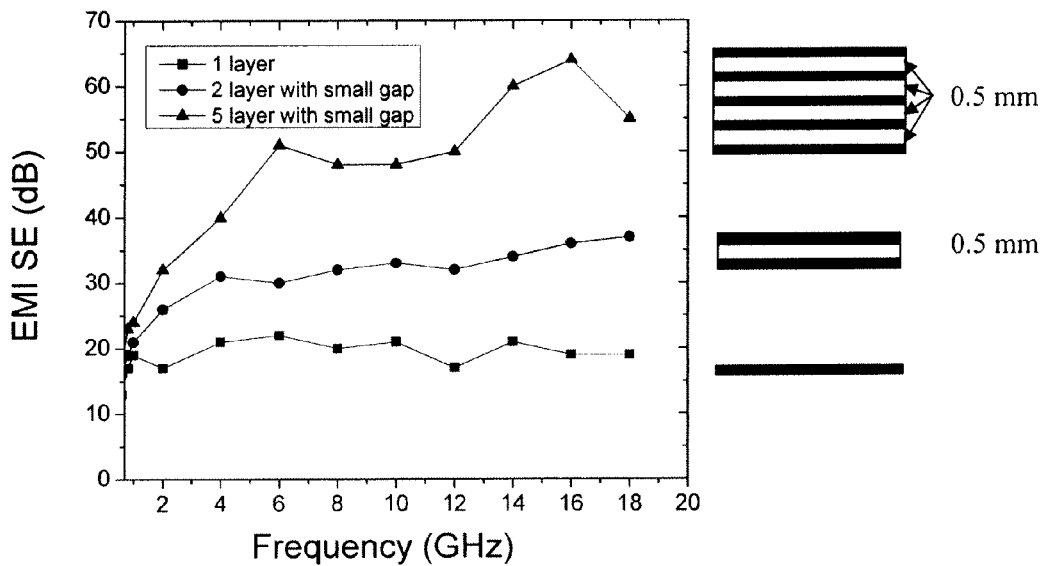
FIG. 6 is a graph of the EMI SE values of other embodiments of composites made in Example 1.

To further improve the shielding effectiveness, up to five BP layers were stacked with small PE gaps of 500 µm, which achieved a maximum of 64 dB at 16 GHz, as shown in FIG. 6. The total thickness of the composite was maintained at less than 2 mm. In the case of multiple layers stacking, even distribution of conducting nanotube layers provided the most effective EMI shielding.

Example 2

In this example, a vacuum bagging process was used to make BP composites for EMI shielding tests. Multiple layers of BP with EPON862 resin and polymethacrylimide (PMI) foam were used to compare their multiple reflection contributions to the EMI SE of the resulting composite structures. A modified MIL-STD-285 was adopted for broadband frequency range and a relatively large test panel size (7"×7") was used. Those results were compared to a theoretical estimation including absorption, reflection, and multiple reflections.

The nanotube materials used were BuckyPearls™, purified single-walled nanotubes (SWNTs) from Carbon Nanotechnologies Inc (CNI). The SWNT BPs were produced using a filtration process. An aqueous suspension of nanotubes was prepared by a multiple-step dispersion procedure using sonication and a surfactant (Triton X-10, from Fisher Scientific). The suspension was filtered through a 0.45 µm filter in order to produce randomly dispersed BP sheets.

BPs having a thickness of 15 to 25 µm and a density of 21.5 g/m$^2$ were produced. The BP provided both good absorption and reflection capabilities. The BPs were used to make buckypaper/foam structures. PMI Rigid Foam Sheet (Degussa AG Rohacell 51) was chosen as a foam material. PMI foam is a closed-cell rigid expanded plastic material for lightweight construction.

Different composite structures were designed and fabricated as shown in FIG. 7 to illustrate the effects of the shielding material arrangement within a composite for EMI shielding. FIG. 7A and FIG. 7B illustrate the structures of composites with three SWNT BP layers on the surface of PMI foam and SWNT BP layers with alternating PMI foam layers as an insulating gap, respectively.

FIG. 7A shows the PMI foam panels with one, two, and three layers of randomly oriented SWNT BP films on the foam surface. The thickness of the foam layer was about 2 mm. FIG. 7B shows the structure with alternating BP layers between the foam layers. The resin-impregnated BP films were co-cured onto the surface or in-between the foam layers using a vacuum bagging process to make sandwich structures. The resin system used was EPON862/CURE EPI W (Shell Chemicals). In the BP composite layers, the SWNT content was about 50 wt. %.

EMI Shield Test

The testing of the samples was in accordance with standard MIL-STD-285. FIG. 8 illustrates a modified MIL-STD-285 test method with consistent specimen size. The testing equipment consisted of a die cast aluminum box, receiving monopole, RF spectrum analyzer, wave guide horn antenna, and a VHF/UHF signal generator. The aluminum box had an open side and the dimensions of the open side were approximately that of the selected sample size. A grounding structure was used to keep any additional radiation from entering the box during the tests. Frequencies ranging from 4 GHz to 18 GHz were produced and guided by the signal generator and the wave-guide antenna. Within the die cast box a receiving monopole used to catch the attenuated fields, and there was an analyzer on the outside was used to quantify the results of the proposed shielding methods. All of these types of materials and testing procedures were used to perform the test under the standards MIL-STD-285 and MIL-STD-461C.

The estimation of the SE in this study was in the far-field limit with incoming plane wave. This means that the distance from the source to the shielding barrier was long enough. There were several factors considered for the comparison of theoretical estimation and experimental results of the EMI SE. In actual measurement of SE of a sample including alternating layers of PMI foam and BP, proper grounding was needed, and a larger PMI gap layer between BP layers may also work as a leak and will reduce SE. In estimating SE, constant conductivity was assumed at all the frequencies, but the conductivity and dielectric constant may actually have been different, especially at high frequency ranges. Therefore, for a more accurate estimation, frequency dependent conductivity and dielectric constant of a material was considered. The attenuation constant, α, determined in Equation (1) is an approximation, with a large loss tangent (tan $\Delta = \in_i / \in_r \gg 1$). At low frequency below 1 GHz, tan $\Delta \gg 1$ and the BP is a good conductor. But at high frequency range, over 10 GHz, there was a large loss tangent close to about 1. Thus, the attenuation constant is given in Equation (9)

$$\alpha = \frac{2\pi}{\lambda_0} \sqrt{\frac{\in_r(\sqrt{1+\tan^2\Delta} \mp 1)}{2}}$$

Equation (9)

where $\lambda_0$ is the wavelength, $\in_r$ is the real part of complex relative permittivity, and the $\mp$ signs are applied for positive and negative $\in_r$, respectively. Therefore, both conductivity and $\in_r$ should be considered together in the EMI SE of BP sample at high frequency range over 10 GHz.

Effect of Internal Multiple Reflections

FIG. 9A shows the estimated SE of single BP layer composites based on their conductivity with and without a multiple reflections induced correction term ($SE_M$). The theoretical calculation of SE in SWNT BP based on the conventional equation (Equation (4)) without a multiple internal reflection correction term is shown with a dashed line at different bulk conductivities. The solid lines are the sum of SE shown in Equations (5), (6), and (7) that includes a correction term and dashed lines are from Equation (4). In both cases, as the conductivity increases, the SE also is increased. However, the frequency dependence is different, especially at low frequency range, and a gap existed over a wider frequency range in the low conductivity case. Because the absorption loss of BP was small at the low frequency region and for the low conductivity case, the contribution of the correction term cannot be neglected.

Due to the small absorption loss in a BP layer, it is reasonable to consider multiple reflections in BP composites, and this estimation will be compared with experimental results. FIG. 9B is the SE estimate result for multiple attached BP layers with different total thickness (15 µm (one layer of BP), 30 µm (two layers of BP), and 45 µm (three layers of BP) and σ=50 S/cm) including a correction term. The different composites had roughly the same SE value over the frequency range. The effect of EMI attenuation was sharply reduced with the increase of BP layers as it approached its skin-depth thickness.

Effect of Shielding Composite Structure Design

FIG. 10A shows the effect of the composite design on SE with a correction term ($SE_M$). For the calculation of SE shown in FIG. 10A, a 15 µm BP thickness and a 15 µm air gap ($\in_0$) were assumed. The structure of two separated BP layers (dotted line) shows a slight enhancement of SE as compared to the structures of two attached BP layers (solid line).

FIG. 10B shows the simulated SE of two separated BP layers with different airgap ($\in_0$) distances. The SE is not doubled by the insulating gap. At a small gap distance, the SE estimate is about the same as the multiple attached BP structures in FIG. 10A. This means that the gap distance between BPs improves the SE. With the assumption of the BP as a metal sheet (tan $\Delta \gg 1$) with σ=50 S/cm and different airgap ($\in_0$), the SE increased with the gap distance increase at higher frequency. In addition, stacking of MWNT/PMMA coated layers with a gap showed a better SE than a SWNT and MWNT mixed composite, which is ascribed to multi-reflections.

EMI SE Results of Composite Structures with Multiple BP Layers

BP layers were stacked on the surface of the composite or in between the PMI foam layer using a vacuum bagging process as shown in FIG. 7A. FIG. 11A shows the SE of one, two, and three adjacent BP layers on the surface of a PMI foam as determined by the modified MIL-STD-265 method. The lines are the SE estimate from FIG. 9B of BPs having different total thickness (d=15, 30 and 45 µm) representing one, two, and three BP. As the number of BP layers increased, the measured SE also increased, but the increment of the SE with additional BP layer decreased. This tendency is consistent with the estimates in FIG. 10A and FIG. 9B with σ=50 S/cm. The shielding performance of the multiple layers structure did not increase linearly due to the skin-depth effect and multiple reflection induced correction term. The increment of EMI attenuation was sharply reduced with the increase of BP layers. Increasing the number of BP layers improved the SE from 22 dB to more than 30 dB. They had more or less the same SE value over the tested frequency range. Therefore, adding shielding material on the surface of composite to achieve high SE was limited by the reflection and multiple reflection terms. The deviation between experiment and theoretical estimation at the high frequency region shown in FIG. 11A may be attributed to both conductivity and the real part of complex relative permittivity being considered together at high frequencies. Therefore, the equation generally used in a conventional composite is not useful for a BP composite where multiple reflections are present due to large surface areas in nanocomposites.

FIG. 11B shows the SE of three BP layers with 2 mm thick PMI foams as shown in FIG. 7B measured in MIL-STD-461C. The EMI SE of three BP layers with alternating PMI foam has more frequency dependence than that of three BP layers stacked together on the surface. The EMI SE is smaller at lower frequency range but is improved at high frequency. The overall tendency looks similar to the theoretical estimates shown in FIG. 10B with an increased gap distance (2 mm foam).

In the case of transparent and thin SWNT film less than 1 µm, SE decreased as frequency increased from 10 MHz to 10 GHz. However, the BP with a thick SWNT network and a thickness of more than 10 µm had an increased SE as a function of frequency over GHz range more than 60 dB. The sharp increase of the SE at high frequency is believed to be due to the increased internal reflection.

The SE of BP composites depends on the conductivity and thickness of BP layers. However, a proper arrangement of BP and insulation layer (PMI foam) in the laminates can higher EMI attenuation due to more internal refection.

Example 3

The EMI SE of BP based composite structures with different conductivities and the effect of multiple layers was studied. A vacuum bagging process was used to make BP composites for EMI shielding tests. The nanotube materials used were BuckyPearls™, purified SWNT (Unidym Inc., TX) made by a Hipco process. In order to reduce the cost and increase the structural integrity of the application, multi-walled carbon nanotubes (MWNTs, Sigma-Aldrich) and vapor-grown carbon nanofiber (VGCNF, Applied Science Inc.) were mixed together with SWNTs in some samples.

The BPs were produced using the filtration process described in Example 2. SWNT BP having a 15 μm thickness and a basis weight of 21.5 g/m$^2$ were produced because of the BP's high electrical conductivity, extremely lightweight structure, and nanoscale porosity. In the case of SWNT/MWNT mixed BP, MWNT or CNF was mixed with SWNT by weight ratio of 1:3 in the suspension. The typical thickness was 20-25 μm, which was thicker than that of the SWNT BP, and hence had a lower density.

The BPs were used to make BP/polymethacrylimide (PMI) foam or BP/glass fiber reinforced polymer (GFRP) composite structures. The structures were fabricated as shown in FIG. 7 to test the effects of the shielding material arrangement within a composite for EMI shielding. FIG. 7A shows the panels with one, two, and three layers of randomly oriented SWNT BP films on the surface of PMI foam or GFRP. Resin-impregnated BP films were co-cured onto the surface of the foam or GFRP using a vacuum bagging process. The resin system used was EPON862/CURE EPI W (Shell Chemicals). In the BP composite layers, the SWNT content was about 50 wt %. The thickness of the composites was about 2 mm.

The layers of BP with EPON862 resin and PMI foam or glass fiber were compared for their multiple reflection contributions to the EMI SE of the resulting composite structures. Those results were compared to theoretical estimation including absorption, reflection, and multiple reflections EMI Shielding Testing The testing of the samples was in accordance with the procedures described in Example 2.

Effect of Conductivity

As shown in FIG. 9A, the conductivity was a factor to improve the SE. FIGS. 12A-B show the SE of BP composites with one and two surface BP layers attached to the glass fiber reinforced polymer (GFRP), respectively. DC conductivities of mixed SWNT/MWNT BPs were around 100 S/cm, which was lower than that of SWNT BP, 200 S/cm. In both of the one and two layer samples, SWNT BP showed better SE than that of mixed BPs because of the higher conductivity. In the case of one mixed BP surface layer, the SE was lower, around 5 dB. The difference in SE was slightly increased with two surface layers. SWNT and MWNT mixed BP showed better SE than that of SWNT and VGCNF mixed BP because of the former material's slightly higher conductivity.

The SE of SWNT BP on GFRP was about the same as the BP on PMI foam substrate in FIG. 11A. The insulating material had no major effect on the shielding performance.

Effect of Shielding Composite Structure

Figure 13:
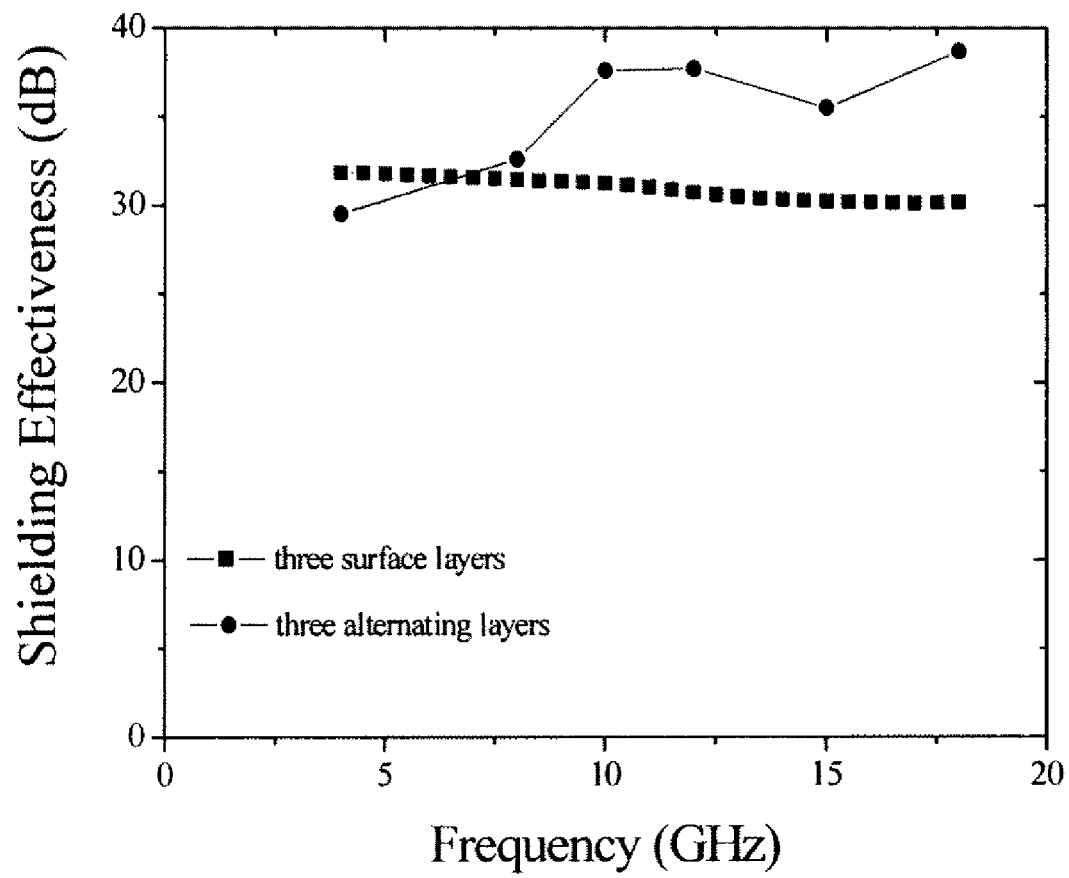
FIG. 13 is a graph showing the estimated and measured EMI SE of alternately stacked PMI composite as made in Example 3.

FIG. 13 shows the EMI SE of an alternate stacked PMI composite measured using MIL-STD-461C. Even though it was difficult to compare them directly due to the differences of the measurement, the EMI SE of the stack of three BP layers and the alternating PMI foam layers had more frequency dependence than that of three BP layers stacked adjacent to each other on the surface of a foam layer. The EMI SE of the structure with alternating BP between insulating gaps was smaller at lower frequency range but was improved at high frequency. The overall tendency looked similar to theoretical estimations in FIG. 10B with an increased gap distance (2 mm foam).

SWNT BP exhibited a higher EMI shielding effect because of its high electrical conductivity. However, increasing the number of surface BP layers had some limitation in achieving high EMI shielding effect. Therefore, in addition to the improvement of electrical conductivity, proper arrangement of BP and insulation layer in the laminates should be considered to achieve higher EMI attenuation due to multiple shield effect.

Example 4

The effects on EMI SE performance of composite laminate structures made with BPs of different conductivity values and epoxy or polyethylene (PE) insulating layer stacking sequences were studied. Composite laminates were made with multiple layers of BP and two types of dielectric materials (EPON862 and polyethylene) by employing different stacking sequences. The resulting structures were studied to determine how the multiple reflection contributions affected the overall EMI SE. A relatively large test panel size (6"×6") was used, and up to 18 GHz was measured using modified MIL-STD-285 or IEEE-STD-299 standard.

The nanotube materials used in the research were purified SWNTs made by the HiPco process (Unidym Inc., TX) or chemical vapor deposition method (Thomas-Swan, UK). To reduce the cost, MWNTs (Cnano, CA and Bayer, Germany) were mixed with SWNTs for BP fabrication. Long-MWNT BPs were purchased from Nanocomp and used "as is" without further filtration procedure.

The BPs were produced using the filtration process described in Example 2, using the surfactant Triton X-100. For mixed BPs, MWNTs were mixed with SWNTs at a weight ratio of 5:1 and dispersed using the same method as for the SWNT suspension. The thickness of long-MWNT BPs from Nanocomp was greater than 40 μm, which is thicker than the other BP materials. The SWNT BPs had a room temperature conductivity was about 200 S/cm. The conductivity of the SWNT and MWNT mixed BP was about 50 S/cm, irrespective of MWNT manufacturers. The conductivity of a long-MWNT BP was 400-1000 S/cm depending on the thickness variation.

To improve the conductivity further, the long-MWNT BP were doped with $SOCl_2$ by soaking the BP in the $SOCl_2$ for 40 hours. The doped BP was then dried under a fume hood. The resulting BP had a conductivity of 6000 S/cm and a reduced thickness of 20 μm due to the dense packing of the nanotubes resulting from the doping process. The conductivity of the $SOCl_2$ doped BP decreased over time, but stabilized at 2000 S/cm after heat treatment of the doped BP at 100° C.

To investigate the effect of lay-up structures of BP composites on the EMI SE, BPs were attached to PMI foam with EPON862/CURE EPI W (Shell Chemicals) and a vacuum-bagging process was used to produce the samples. To develop lightweight flexible EMI shielding materials, BPs with low density PE laminates were made by a vacuum bagging process and heated to slightly above the melting temperature of PE (149° C.). In the BP composite layer, the CNT content was about 50 wt. %.

Since the thickness of BP is several tens of micrometers, BP/PE composites can be very thin and flexible, yet highly conductive. The total thickness of the EMI shielding sample (BP/PE composite) was kept at less than 2 mm, maintaining the light weight and flexibility.

EMI Shielding Effectiveness Tests

For EMI shielding effectiveness, the samples were tested in accordance with modified IEEE-STD-299 standards and in accordance with modified MIL-STD-285 standards. During the tests, the transmitter and receiver antennas were placed on either side of a 3.5" diameter aperture (or 6" side panel) in the shielded enclosure. Open reference measurements were taken through this opening. Each sample was placed at this location, and shielding effectiveness was estimated. The tests were performed at frequencies ranging from 1 GHz (or 4 GHz) to 18 GHz, with the reliability of the measurement at 3 dB.

Figures 14A, 14B:
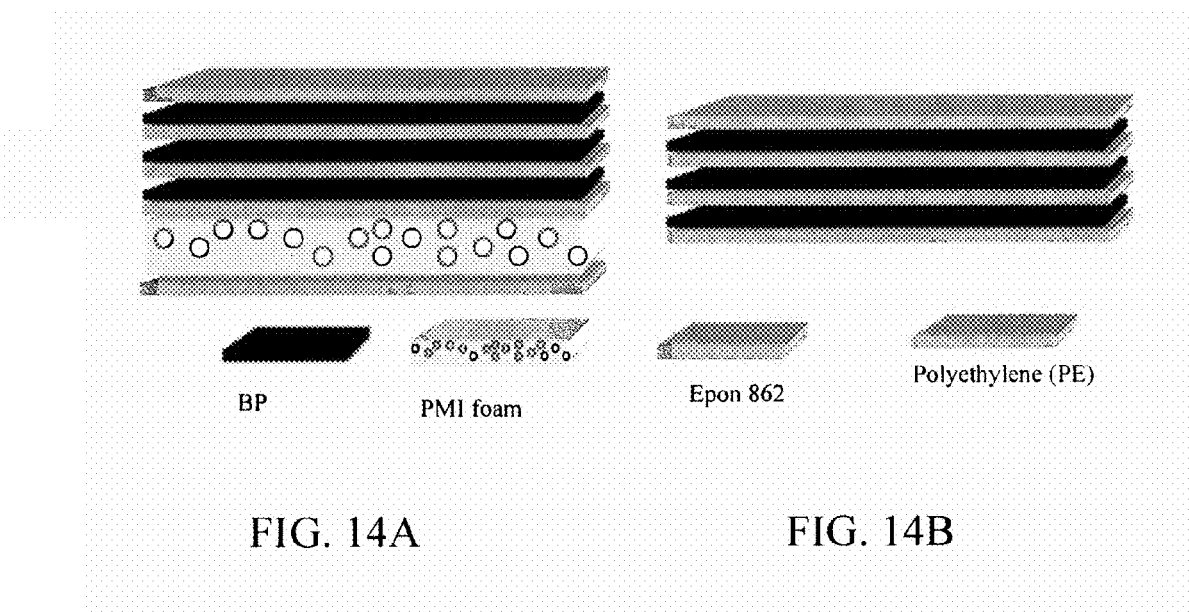
FIGS. 14A-B are schematics illustrating the structure of the multiple BP layer composites made in Example 4.
Figure 15:
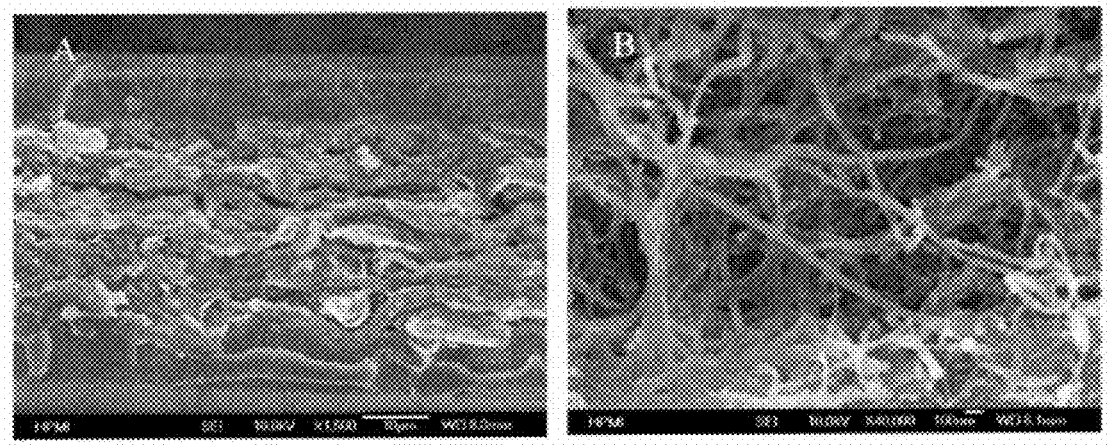
FIGS. 15A-B are SEM micrographs of the SWNT BP/PE composite with PE made in Example 4.

In order to effectively utilize minimal thickness, high conductivity and a large surface area BP conducting layers were used and insulating gap layers were inserted therebetween to increase the multiple reflections contribution. Since the inserted insulation layers possessed a different conductivity and dielectric constant, the BP/insulating interface led to additional internal reflection loss. If multiple BP layers with inserted insulating layers were used, the reflection loss was the sum of all the interfaces formed on the BP layers and insulating layers. The schematic structure of the multiple BP layer composites is shown in FIGS. 14A-B. FIGS. 15A-B are SEM micrographs of the resulting SWNT BP/PE composite with PE after the vacuum bagging process.

Effect of Conductivity

To determine the effects of conductivity in BP composites, BPs of different conductivity in the composites were studied. The characteristics of each BP were summarized in Table 1.

TABLE 1

Summary of BP properties

| | Nanotube manufacturer | Typical BP conductivity (S/cm) | Thickness (μm) |
|---|---|---|---|
| SWCNT BP | Unidym | 200 | 10-15 |
| Mixed BP 1 | Thomas-Swan, Cnano | 50 | 20-25 |
| Mixed BP 2 | Thomas-Swan, Bayer | 50 | 20-25 |
| Long-MWCNT BP | Nanocomp | 400-1000 | 20-60 |
| SOCl$_2$ doped Long-MWCNT BP | Nanocomp | 6000 | 20-25 |

Figure 16:
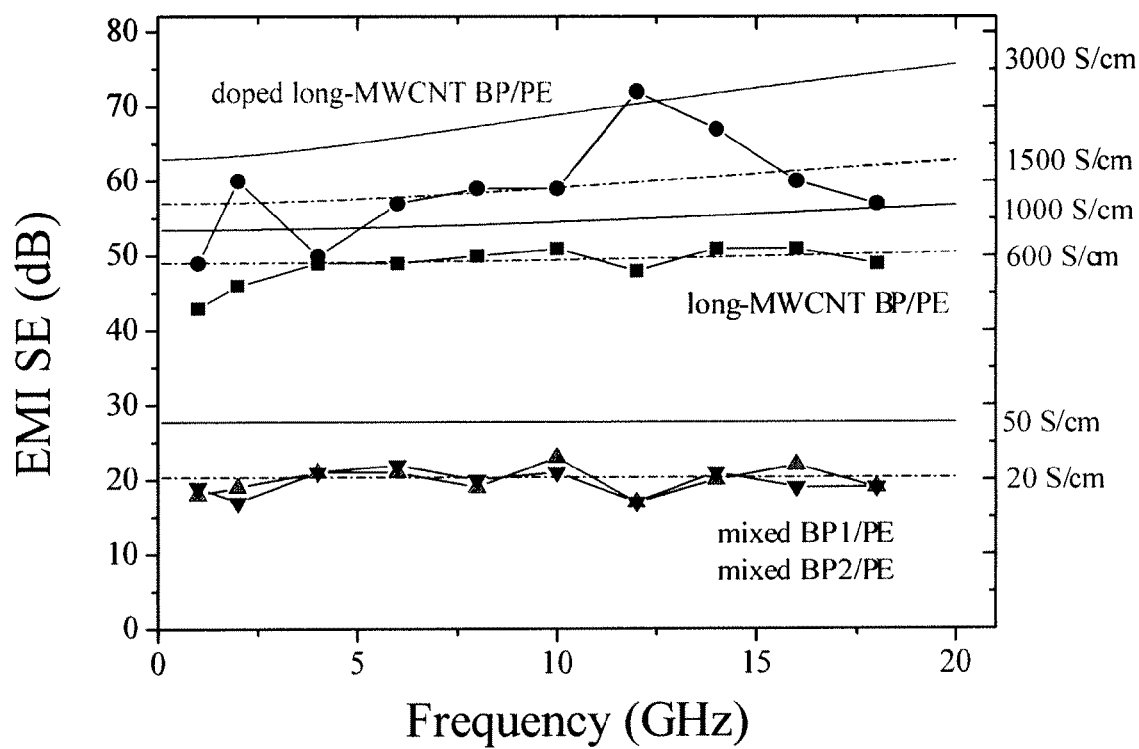
FIG. 16 is a graph showing EMI SE comparison of the modeling and experimental results of a single BP layer/PE composite described in Example 4.

FIG. 16 shows the EMI SE comparison of the modeling and experimental results of a single BP layer/PE composite. DC conductivities of mixed BP/PE composites were less than 50 S/cm due to polymer infusion and SE of their laminates was less than 20 dB. The solid lines show the SE estimates based on σ=50 S/cm and the dashed lines show the best fit of data with σ=20 S/cm, which is the effective conductivity of BP/PE layer. Long-MWNT BP with a conductivity of around 1000 S/cm resulted in 50 dB throughout the frequency range up to 18 GHz and σ=600 S/cm gives the best fit. The doped long-MWNT BP composite sample demonstrated the most enhanced EMI SE, over 70 dB at 12 GHz, with only one sheet of BP. The estimated conductivity from the fitting was around 1500 S/cm. Even though the estimated effective conductivity of BP layer after polymer infusion was reduced, the SE increased proportionally with the conductivity of original BP. Therefore, higher conductivity of BP is a factor in achieving high EMI shielding performance.

Effect of Shielding Composite Structure

Figure 17:
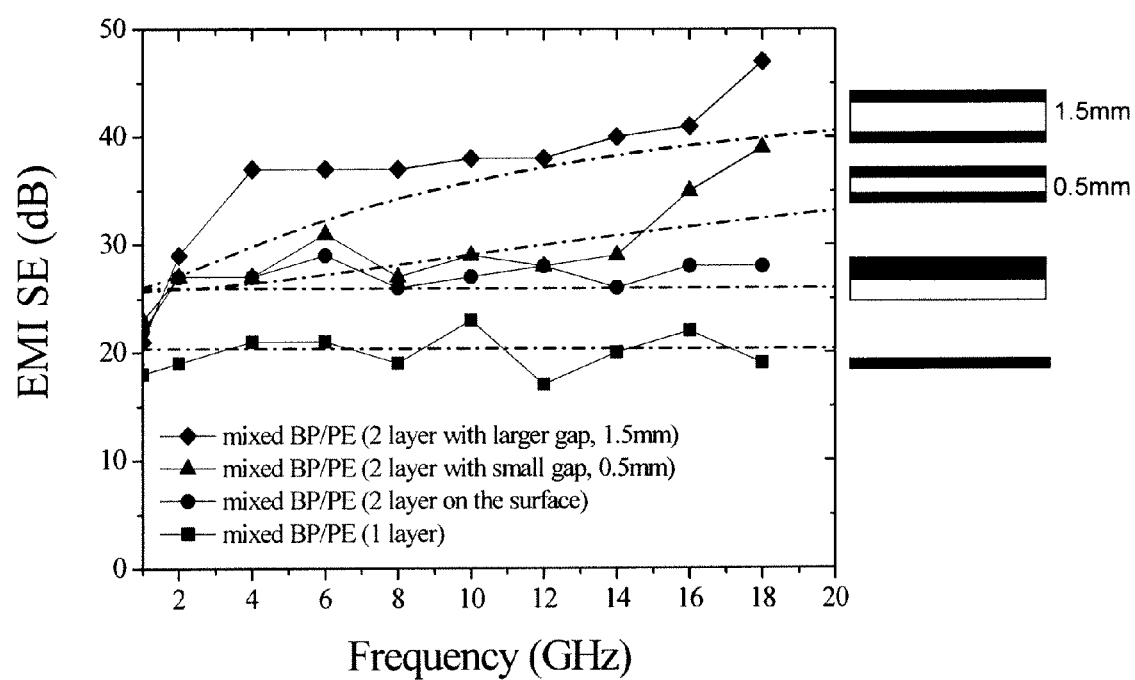
FIG. 17 is a graph showing the EMI SE of the mixed BP/PE composites with different stacking or lay-up structures made in Example 4.

FIG. 17 shows the EMI SE of the mixed BP/PE composites with different stacking or lay-up structures. A one layer BP/PE composite showed the lowest SE at around 20 dB all over the frequency range. Two layers of BP on the surface of the PE substrate showed minimal improvement (a 5-7 dB increase). These results were consistent with the results of FIG. 11A. By adding 0.5 mm and 1.5 mm PE layers between the BP/PE layers, as shown in the right side of FIG. 17, the SE further improved. As expected in the theoretical estimate of FIG. 10B, a larger gap between the conducting layers provides significantly better shielding performance with the same amount of BP, especially at frequencies higher than 10 GHz. The SE difference between small gap and large gap distance is negligible at low frequency, but the SE increased faster in the case of larger gap as expected by FIG. 10B. Dashed lines are estimated results based on BP/PE layer conductivity of 20 S/cm that is from the best fit from the data in FIG. 16. Theoretical estimates and experimental data followed a similar frequency dependence. A slight deviation between them might have originated from the conductivity and gap variation. Since the absorption contribution of two BP/PE layers was about 5 dB at 20 GHz, most of the difference at higher frequency came from the correction term ($SE_M$).

Figure 18:
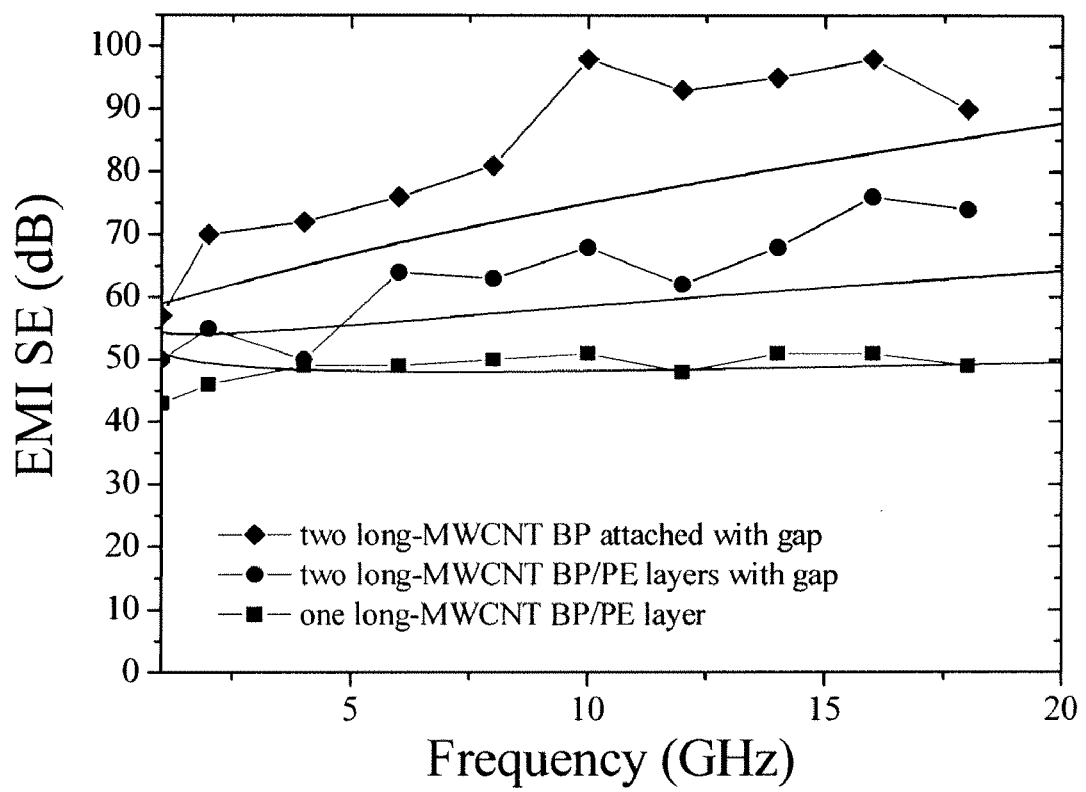
FIG. 18 is a graph showing the comparison of SE for the long-MWNT BP layer with and without PE impregnation and a one layer long-MWNT BP/PE as described in Example 4.

For sample in which EPON862 resin or PE was infused into the BP layer, the intertube contact resistance of the BP was increased. Hence, the effective conductivity of BP/PE layer was reduced by 40 to 60% as compared to that of original BP. This decreases the EMI SE in the composite. Therefore, to improve the SE performance, instead of substantial impregnation with a polymer, the BP layer was attached to the surface of the PE substrate by melting the surface of the PE substrate such that it adhered to the BP surface under less than 1 MPa pressure and the BP maintained its original conductivity. FIG. 18 shows the comparison between the long-MWNT BP layer with and without PE impregnation and compared to the SE of one layer long-MWNT BP/PE that is shown in FIG. 9A. The estimated conductivity of one long-MWNT BP/PE layer is around 600 S/cm, and absorption loss ranged from 3.3 dB to 13 dB for a frequency range of 1 GHz to 18 GHz. Therefore, two highly conducting long-MWNT BP layers gave absorption losses ranging from 6.7 dB to 25.9 dB and simplified form in Equation (4) can be used especially at high frequency range over 5 GHz. The two solid lines at the bottom were based on the conventional form with one and two long-MWNT BP/PE layer with effective conductivity of 600 S/cm (t=25 and 50 μm respectively). The top line is for two long-MWNT BP with conductivity of 500 S/cm (t=100 μm). With insertion of PE gap (1.5 mm), SE data show better than the theoretical estimation without it. Therefore, insertion of an insulation gap between the conducting layers, and a reduction of the polymer infusion into the BP layer significantly improved EMI SE with the same amount of BP.

Single-layer BP composites showed shielding effectiveness (SE) of 20 dB to 60 dB, depending on BP conductivity within a 2-18 GHz frequency range. In addition, increasing the number of BP layers and proper arrangement of the BP conducting layers and insulators can increase the EMI SE from 45 dB to close to 100 dB due to utilizing the double shielding effect. Furthermore, achieving up to 100 dB SE with only two BPs with a designed insulating gap was demonstrated.

Publications cited herein are incorporated by reference. Modifications and variations of the methods and devices described herein will be obvious to those skilled in the art from the foregoing detailed description. Such modifications and variations are intended to come within the scope of the appended claims.

We claim:

1. An electromagnetic interference shielded apparatus comprising:
   an electrical circuit in need of electromagnetic interference shielding; and
   a body at least partially surrounding the electrical circuit, the body comprising a composite material that includes at least two electrically conductive nanoscale fiber films overlying and spaced apart from one another with at least one insulating gap positioned between the at least two nanoscale fiber films, wherein the nanoscale fiber films and the insulating gap are effective to provide a substantial multiple internal reflection effect in shielding the electrical circuit from electromagnetic interference.

2. The apparatus of claim 1, wherein at least one of the nanoscale fiber films comprises a buckypaper and the at least one insulating gap comprises air or a dielectric film.

3. The apparatus of claim 1, wherein the composite material provides an electromagnetic interference shielding effectiveness ranging from 5 dB to 100 dB.

4. The apparatus of claim 1, wherein the composite material further comprises one or more structural materials.

5. A method for shielding an electrical circuit from electromagnetic interference comprising:

positioning a composite material between the electrical circuit and an electromagnetic energy transmission source, the composite material comprising at least two electrically conductive nanoscale fiber films overlying and spaced apart from one another with at least one insulating gap positioned between the at least two nanoscale fiber films, wherein the nanoscale fiber films and the insulating gap are effective to provide a substantial multiple internal reflection effect to shield the electrical circuit from electromagnetic interference generated by the transmission source.

6. The method of claim 5, wherein at least one of the nanoscale fiber films comprises a buckypaper and the at least one insulating gap comprises air or a dielectric film.

7. The method of claim 5, wherein the composite material provides an electromagnetic interference shielding effectiveness ranging from 5 dB to 100 dB.

8. The method of claim 5, wherein the composite material provides an electromagnetic interference shielding effectiveness ranging from 50 dB to 100 dB.

9. The method of claim 8, wherein the composite material is flexible and has a thickness of about 2 mm or less.

* * * * *